United States Patent
Kamiya

(10) Patent No.: US 6,937,462 B2
(45) Date of Patent: Aug. 30, 2005

(54) ELECTRONIC CONTROL DEVICE AND MANUFACTURING METHOD FOR THE SAME

(75) Inventor: Takamichi Kamiya, Kasugai (JP)

(73) Assignee: Denso Corporation, Kariya (JP)

( * ) Notice: Subject to any disclaimer, the term of this patent is extended or adjusted under 35 U.S.C. 154(b) by 150 days.

(21) Appl. No.: 10/378,665

(22) Filed: Mar. 5, 2003

(65) Prior Publication Data

US 2004/0066602 A1 Apr. 8, 2004

(30) Foreign Application Priority Data

Mar. 7, 2002 (JP) ....................................... 2002-062399

(51) Int. Cl.[7] ............................................... G06F 1/16
(52) U.S. Cl. ..................... 361/679; 257/706; 29/840; 165/185
(58) Field of Search ................... 361/679–687, 361/724–727, 720; 165/80.3, 185; 257/687, 691, 706, 707; 29/832, 840

(56) References Cited

U.S. PATENT DOCUMENTS

| 4,858,071 A | 8/1989 | Manabe et al. ............. 361/720 |
| 4,910,434 A | 3/1990 | Doumani et al. .............. 315/3 |
| 6,341,066 B1 * | 1/2002 | Murowaki et al. .......... 361/707 |
| 6,487,995 B2 * | 12/2002 | Markyvech et al. ...... 123/41.31 |
| 2004/0052041 A1 * | 3/2004 | Yair et al. .................... 361/683 |

FOREIGN PATENT DOCUMENTS

JP    H1-214028    8/1989

* cited by examiner

Primary Examiner—Hung Van Duong
(74) Attorney, Agent, or Firm—Posz Law Group, PLC

(57) ABSTRACT

An electronic control device has a housing, a circuit board, and a connector. One of surfaces of the housing is formed as a mounting surface. The circuit board including a heat-producing component is fixed to an inner wall of the housing. The connector is electrically connectable with an external device. The mounting surface and the inner wall, to which the circuit board is fixed, are located on opposite sides of the housing. The circuit board and the connector are electrically connected to each other via a flexible connecting member.

19 Claims, 5 Drawing Sheets

ELECTRONIC CONTROL DEVICE AND MANUFACTURING METHOD FOR THE SAME

CROSS REFERENCE TO RELATED APPLICATION

This application is based on and incorporates herein by reference Japanese Patent Application No. 2002-62399 filed on Mar. 7, 2002.

FIELD OF THE INVENTION

The present invention relates to an electronic control device and its manufacturing method.

BACKGROUND OF THE INVENTION

Referring to FIG. 5, an electronic control device includes a housing and an electronic circuit board 510. The control device is used for an internal combustion engine for a vehicle. The housing is constructed of a case 520 and a cover 530, and houses the electronic circuit board 510. The circuit board 510 is fixed to an inner wall of the cover 530 adjacent to connectors 540, and electrically connected to the connectors 540 via bonding wires 550. With this configuration, an area of the control device mounted on an engine is relatively small.

In such an electronic control device, heat-producing component 511, such as a semiconductor switch, may be mounted on the circuit board 510. Heat produced in the heat-producing components is transmitted to the inside surface of the cover 530, and the outside surface. Then, the heat is released to an inner space of an engine compartment. The heat is also transmitted from an inner wall of the cover 530 to an engine block via a side wall 530$h$.

However, improving heat dissipation is not fully considered in the control device. The temperature of the engine compartment is close to the highest heat-resistant temperature of the component 511. Therefore, releasing the heat via heat radiation is limited. On the other hand, an engine block is generally cooler than a room temperature of an engine compartment. Therefore, releasing the heat via the engine block is effective. However, the side wall 530$h$ of the cover 530 is relatively thin and thermal resistance is high. Thus, an efficiency of the heat conduction is low.

To solve this problem, another electronic control device shown in FIG. 6A is provided. A circuit board 610 is directly mounted on the base 620 to reduce the thermal resistance, as shown in FIG. 6A. To connect the connectors 640 to the circuit board 610 via bonding wires 650, bonding terminals 640$a$ need to be extended from the connectors 640 along the circuit board 610. Therefore, the size of the control device becomes large.

Referring to FIG. 6B, bonding terminals 610$a$ and bonding terminals 640$a$ are provided on the circuit board 610$a$ and on the outer periphery of the connectors 640, respectively. The bonding terminals 610$a$ and the bonding terminals 640$a$ are substantially perpendicular to each other and connected together via bonding wires 650. However, a bonding device for bonding the terminals 610$a$, 640$a$ with the bonding wires 650 is not commonly used. Developing of the device may affect a manufacturing cost of the control device.

Furthermore, making an engine compartment small in size and high in density is a social demand from the point of view of resource-savings. To meet the demand, the electronic control device needs to be improved in heat-dissipation efficiency and to be small in size. Even though the control device is used under the high temperature, the control device is still expected to have high heat-dissipation efficiency and to be small in size.

SUMMARY OF THE INVENTION

The present invention therefore has an objective to provide an electronic control device that has improved heat-dissipation efficiency without increasing its size and its manufacturing method. An electronic control device of the present invention has a housing, a circuit board, and a connector. The housing has a mounting surface on one of its faces. The circuit board fixed to an inner wall of the housing has a heat-producing component. The connector is electrically connectable to an external device. The circuit board and the connector are electrically connected to each other via a flexible connecting wire.

The circuit board is directly fixed to the inner wall of the housing, the outer wall of which is the mounting surface. Therefore, heat produced in the heat-producing component is transmitted to the engine block via the mounting surface. The heat is efficiently released from the circuit board to the outside without being affected by the thermal resistance depending on the thickness of the housing walls.

Furthermore, a flexible connecting wire, such as a flexible printed circuit board (PCB), is used for electrically connecting the connector and the circuit board. This improves the flexibility in arranging the connector and the circuit board compared to connecting them with a bonding wire. Therefore, the mounting area of the housing or the manufacturing cost of the electronic control device can be maintained low.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

The preferred embodiments of the present invention will be explained with reference to the accompanying drawings.

In the drawings, the same numerals are used for the same components and devices.

[First Embodiment]

Figure 1:
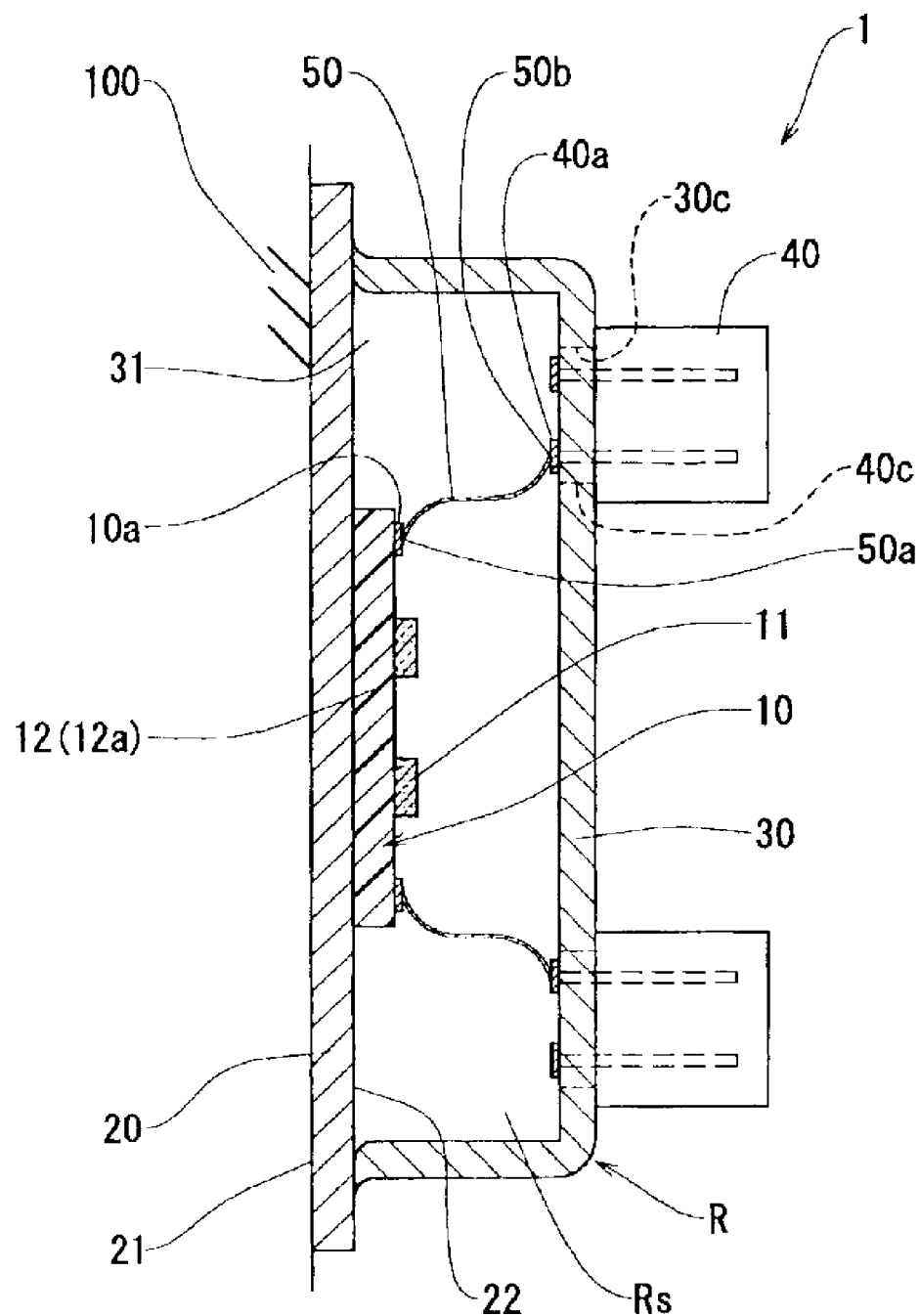
FIG. 1 is a cross-sectional view of an electronic control device according to the first embodiment of the present invention.

Referring to FIG. 1, the electronic control device 1 includes a circuit board 10, a first housing member (a base) 20, and a second housing member (a cover) 30. The circuit board 10 has electronic components 11 including ICs and semiconductors. The base 20 supports the circuit board 10 and houses the circuit board 10 together with the cover 30. The electronic components 11 include heat-producing components, such as a semiconductor switching component. The components 11 are used for performing PWM control or PFM control to a fuel injection device (not shown) or an ignition device (not shown). The fuel injection device supplies fuel to an engine based on the number of revolution of the engine or a load. The ignition device ignites the fuel supplied to the engine.

The control device 1 is not limited to a control device that controls an engine, such as an ECU. The control device 1 can be used for controlling an armature of a generator, or an electric motor of an electric vehicle. However, the control device 1 needs to be mounted on the armature or the motor, and the temperature of the armature or the motor needs to be lower than the room temperature of an engine compartment.

In this embodiment, the control device 1 is an ECU that controls an engine 100, and fixed around the engine 100, for instance, an engine block. The base 20 ant the cover 30 are cast in metal, such as aluminum and aluminum alloy. The base 20 is formed in substantially plate shape and covers an opening 31 of the cover 30. The base 20 and the cover 30 can be formed in different ways other than casting. For example, they may be formed by pressing.

The base 20 and the case 30 constitute a housing R when they are assembled together. The base 20 has a mounting surface 21, which is fixed to the engine block 100. The mounting surface 21 may be included in the case 30, instead of the base 20. It can be included in either the base 20 or the case 30 as long as the connectors 40 and the engine block 100 do not interfere with each other.

The circuit board 10 is a printed circuit board (PCB). Electronic components 11 including heat-producing components, such as a semiconductor switching component, are mounted on a substrate 12 included in the PCB 10. The substrate 12 has an insulated substrate 12a and circuit patterns (not shown) on or inside the substrate 12a. The circuit patterns are electrically connected to the electronic components 11.

The connectors 40 are electrically connected to the PCB 10 so that the electronic components 11 can communicate with external devices via the circuit patterns. More specifically, the electronic components 11 are electrically connected to the circuit patterns, and the circuit patterns are connected to the connectors 40. The electronic components 11 receive external signals via the connectors 40 and the circuit patterns. The PCB 10 and the connectors 40 have connecting terminals 10a, 40a, respectively so that they are electrically connected together via flexible connecting wires 50.

The connectors 40 are not limited to the configuration shown in FIG. 1. They may be arranged on the base 20 and extends in the direction substantially parallel to the engine block 100. However, the mounting surface of the housing R becomes larger with this configuration.

The base 20 and the cover 30 are fixed together with mounting screws (not shown). They can be fixed by different methods. For example, mounting holes and protrusions are provided in extended portions of the base 20 and the cover 30, respectively. The base 20 and the cover 30 are fixed together by inserting the protrusions into the mounting holes. Alternatively, the base 20 and the cover 30 are fixed with glue.

The base 20 has an inner wall 22, on which the PCB 10 is mounted, and a mounting surface 21 opposite to the inner wall 22. The mounting surface 21 is fixed to the engine block 100. Since the PCB 10 is directly fixed to the base 20, which is directly fixed to the engine block 100, heat generated in the components 11 is directly transmitted to the engine block 100. The thickness of the inner walls of the housing R does not affect the heat dissipation in this configuration. Therefore, the heat is efficiently released from the PCB 10 to outside the housing R, compared to the configuration that the PCB is fixed to other walls of the housing R.

The connectors 40 for electrical connection with external devices are electrically connected with the PCB 10 via the flexible wires 50. This makes arrangements of the PCB 10 and the connector 40 in the housing R more flexible, compared to using bonding wires. Therefore, the control device 1 can be configured so that it has a small mounting surface and it is manufactured at low cost.

Flexible printed circuit boards (PCBs) are used for the flexible connecting wires 50. The flexible PCBs are connected to connecting terminals 10a, 40a of the PCB 10 and the connectors 40, respectively. By using the flexible PCBs, parts cost become reasonable and connections between the connecting terminals 10a, 40a become more flexible. Therefore, the control device 1 can be configured so that it has a small mounting surface and an efficiency of the heat dissipation is improved.

Assembly steps of the electronic control device 1 shown in FIG. 1 will be explained below.

The first end 50a of each flexible PCB 50 is connected to a respective connecting terminal 10a of the PCB 10 for electrically connecting the PCB 10 with the connector 40. The flexible PCB 50 and the connecting terminal 10a are connected by soldering.

The PCB 10 is fixed to the base 20. The cover 30 is screwed down to the base 20, and a PCB housing space Rs is formed. The second end 50b of the flexible PCB 50 is pulled out of the cover 30 via the cover hole 30c. The second end 50b is electrically connected to the connecting terminal 40a. The connector 40 and the cover 30 are fixed. It is preferable that the connecting end 40c is formed in a shape fit for the cover hole 30c.

Figure 2A:
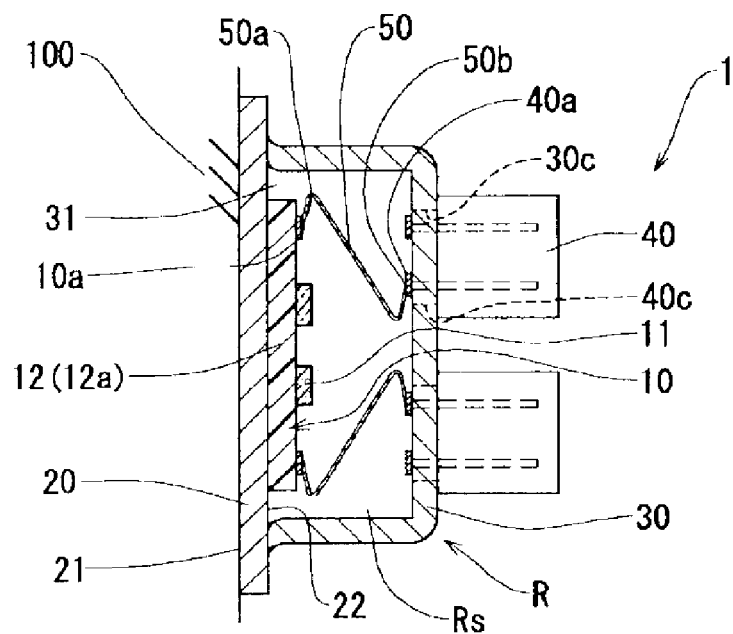
FIG. 2A is a cross-sectional view of an electronic control device according to a modification of the first embodiment.

The connectors 40 may be arranged so that non-opposing exterior sides of the connectors 40 are coincident with an exterior side of the PCB 10, as shown in FIG. 2A. As a result, the cover holes 30c are located vertically inside the PCB 10 in the view of FIG. 2A. The flexible PCBs 50 are warped in S-shape for electrically connecting the PCB 10 and the connectors 40. By arranging connectors in such positions, the mounting surface of the control device 1 can be reduced.

Figure 2B:
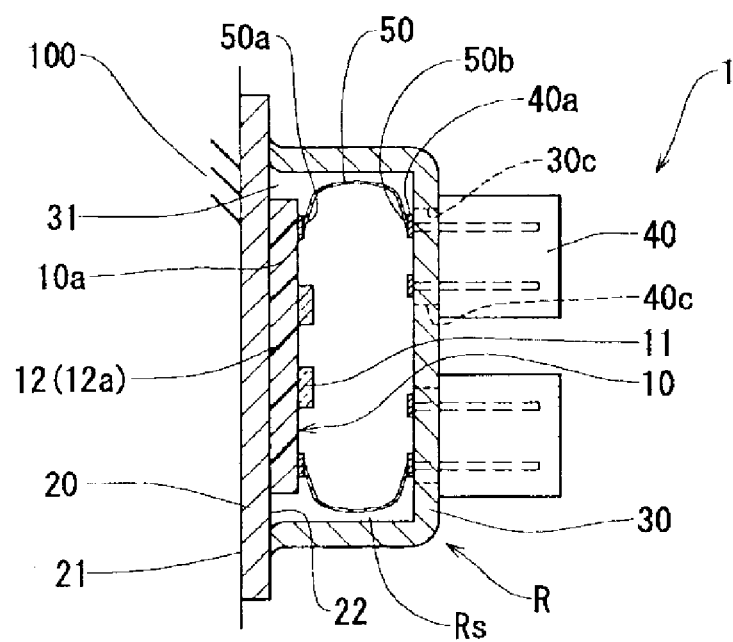
FIG. 2B is a cross-sectional view of an electronic control device according to another modification of the first embodiment.

The flexible PCBs 50 may be warped in U-shape as shown in FIG. 2B. This also produces the same effect as the flexible PCBs 50 warped in S-shape.

[Second Embodiment]

Figure 3:
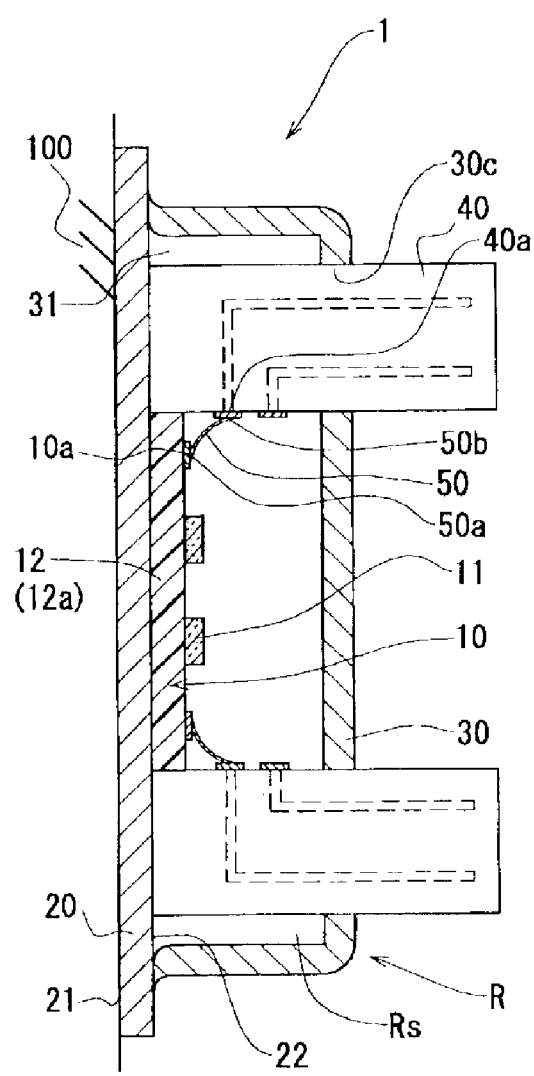
FIG. 3 is a cross-sectional view of an electronic control device according to the second embodiment of the present invention.

The connecting terminals 10a, 40a are substantially perpendicular to each other as shown in FIG. 3. A wire bonding device is not commonly used for connecting members that are arranged perpendicular to each other. However, the flexible PCBs 50 are used in this embodiment. Therefore, the connecting terminals 10a, 40a can be arranged in those positions. Manufacturing processes of the control device 1 can be planed without concern for connecting devices, such as a wire bonding device, and steps of the processes can be reduced.

Assembly steps of the electronic control device 1 shown in FIG. 3 will be explained below.

The connecting terminals 40a are electrically connected to the second ends 50b. The PCB 10 and the connectors 40 are fixed to the base 20. The first ends 50a are fixed to the connecting terminals 10a for electrically connecting the flexible PCBs 50 to the PCB 10. The cover 30 is screwed down to the base 20.

In the step of fixing the PCB 10 and the connectors 40, it is preferable that the PCB 10 and the connectors 40 are arranged closed to each other to reduce the size of the mounting surface 21. It is also preferable that the connecting terminals 40a are positioned on outer peripheries of the connectors 40. By doing so, the connecting terminals 10a, 40a can be easily arranged close to each other when the PCB 10 and the connectors 40 are fixed to the base 20. As a result, the assembly steps are reduced, and the manufacturing cost of the control device 1 can be reduced.

[Third Embodiment]

Figure 4:
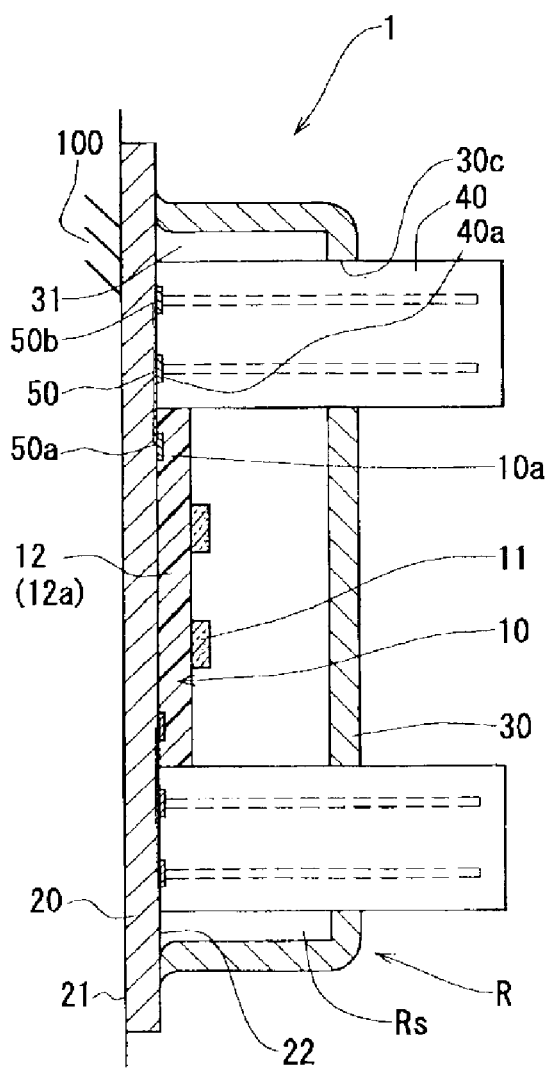
FIG. 4 is a cross-sectional view of an electronic control device according to the third embodiment of the present invention.
Figure 5:
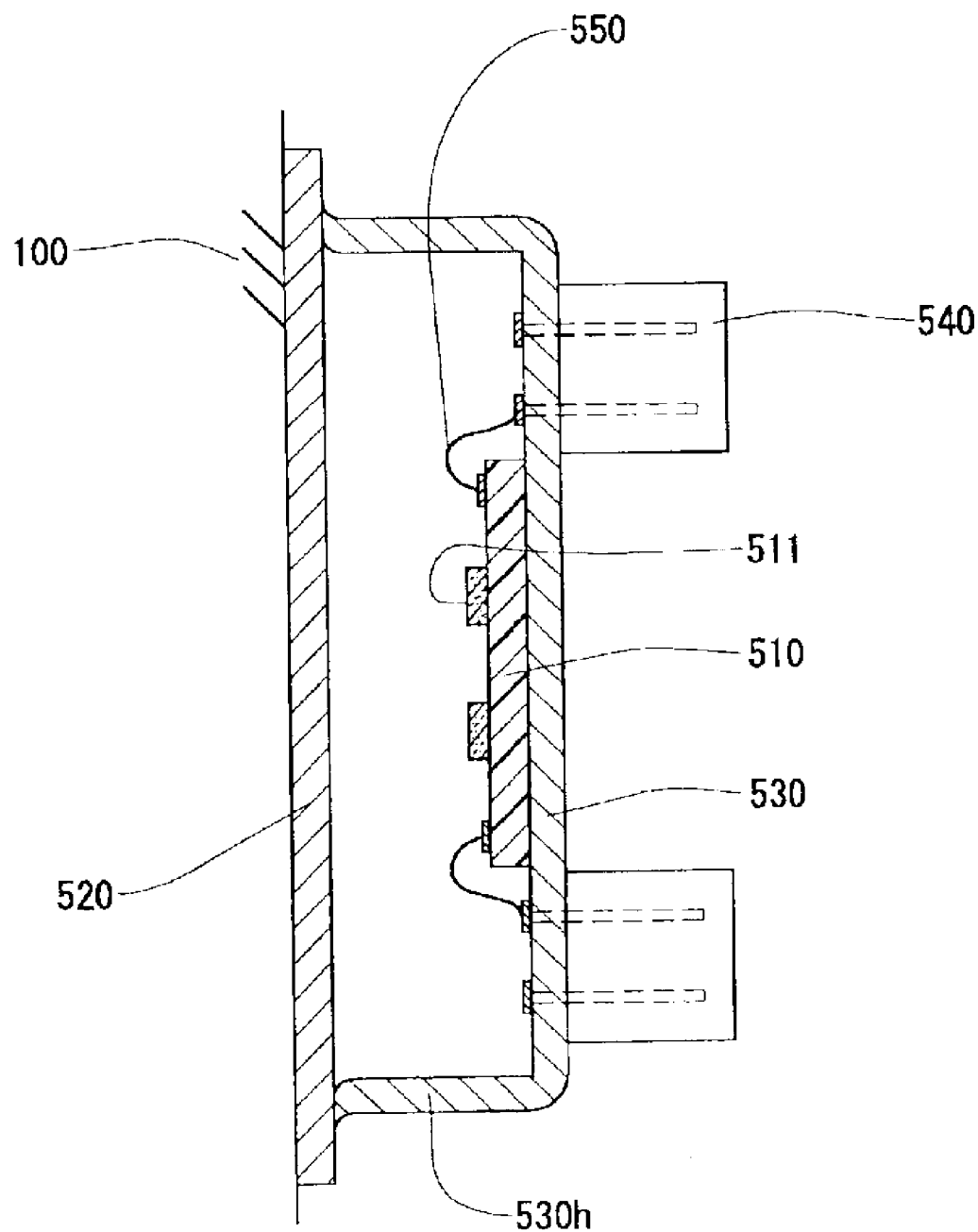
FIG. 5 is a cross-sectional view of an electronic control device according to a related art
Figure 6A:
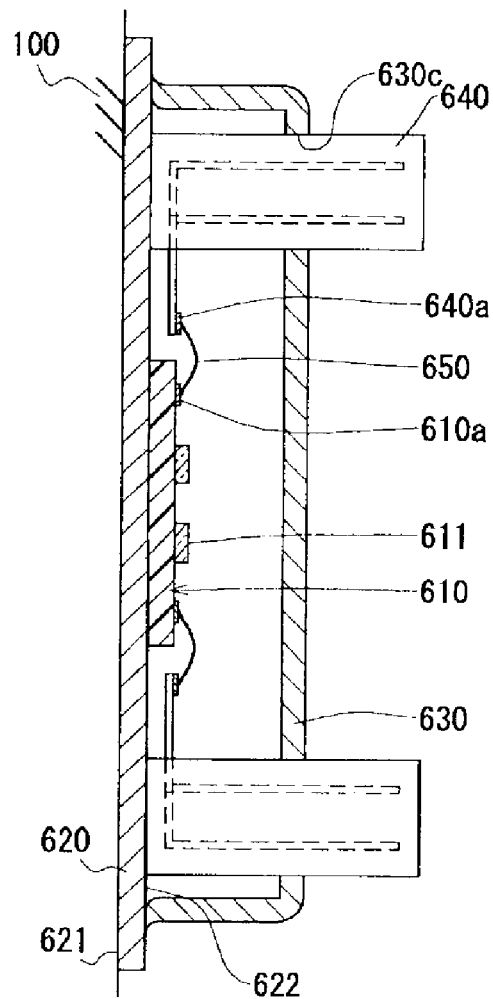
FIG. 6A is a cross-sectional view of an electronic device according to a related art.
Figure 6B:
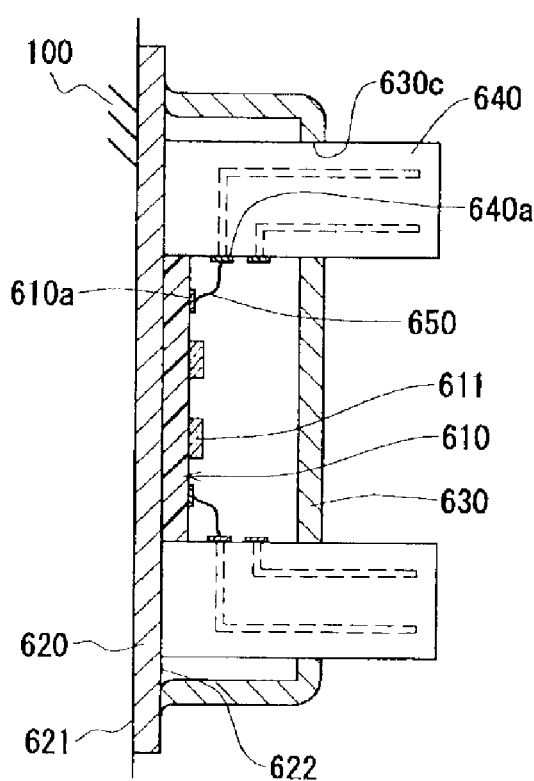
FIG. 6B is a cross-sectional view of an electronic control device according to a related art.

Referring to FIG. 4, the PCB 10 and the connectors 40 are fixed to the base 20. A first end 50a of each flexible PCB 50 is placed between the base 20 and the PCB 10, and a second end 50b is placed between the base 20 and the connector 40. The ends 50a, 50b are connected to the connecting terminals 10a, 40a, respectively for electrical connection.

The flexible PCBs 50 are placed adjacent to the base 20, then the PCB 10 and the connectors 40 are both fixed to the base 20, covering the flexible PCBs 50. Therefore, connecting steps of the connecting terminals 10a, 40a, and assembly steps of the PCB 10 and the connectors 40 can be combined. In other words, the assembly steps and cost of the control device 1 can be reduced.

In the assembly steps, the flexible PCBs are connected to connecting terminals provided on a flat surface of the PCB 10 and the connectors 40. This also electrically connects the PCB 10 with the connectors 40. A flat side of the unit of the PCB 10, connectors 40 and flexible PCBs 50 assembled in the above step is fixed to the base 20. The cover 30 is fixed to the base 20. Therefore, the assembly steps are reduced compared to the first and the second embodiments.

The present invention provides not only the electronic control device that has a small mounting surface and improved heat dissipation, but also that are in various sizes and costs depending on the demand.

The present invention should not be limited to the embodiment previously discussed and shown in the figures, but may be implemented in various ways without departing from the spirit of the invention. For example, the electronic control device 1 can be fixed to other parts in the engine compartment, rather than the engine block 100.

What is claimed is:

1. An electronic control device comprising:
    an electronic unit having a circuit board and a heat-producing component that is mounted on the circuit board;
    a housing that houses the electronic unit;
    a connector that electrically connects the electronic unit with an external electrical device; and
    a flexible connecting member that electrically connects the connector with the electronic unit, wherein
    the housing has a first inner wall, a mounting surface, and an outer wall,
    the first inner wall is located inside the housing,
    the mounting surface is located on a reverse side of the first inner wall,
    the outer wall is located outside the housing and on an opposite side of the housing to the mounting surface,
    the circuit board is fixed to the first inner wall,
    the mounting surface can be fixed to an external device,
    the connector is arranged on the outer wall of the housing in a manner at extends from the outer wall,
    the circuit board has a first connecting terminal and the connector has a second connecting terminal,
    the flexible connecting member has a first end and a second end,
    the first end of the flexible connecting member is directly connected to the first connecting terminal, and
    the second end of the flexible connecting member is directly connected to the second connecting terminal.

2. The electronic control device according to claim 1, wherein the flexible connecting member is a flexible printed circuit board.

3. The electronic control device according to claim 1, wherein
    the first connecting terminals and the second connecting terminal are arranged on a same plane.

4. The electronic control device according to claim 1, wherein the external device to which the mounting surface is fixed is an engine block of an internal combustion engine.

5. The electronic control device according to claim 1, wherein:
    the housing further includes a second inner wall;
    the connector penetrates the second inner wall at one end; and
    the connector is arranged in a manner that at least part of the connector directly faces the circuit board.

6. The electronic control device according to claim 1, wherein the first connecting terminal and the second connecting terminal are arranged perpendicular to each other.

7. The electronic control device according to claim 6, wherein the second connecting terminal is arranged on an outer periphery of the connector.

8. A method for assembling an electronic control device having an electronic unit, a housing that is constructed of a base and a cover, a connector for electrically connecting the electronic unit with an external electrical device, and a flexible connecting member, comprising the steps of:
    electrically and directly connecting a first end of the flexible connecting member to a circuit board included in the electronic unit;
    fixing the circuit board to an inner wall of the base of the housing, the inner wall being located on a reverse side of a mounting surface of the base;
    fixing the cover of the housing to the base, the cover having a cover hole;
    taking a second end of the flexible connecting member out of the cover via the cover hole;
    electrically and directly connecting the second end of the flexible connecting member to the connector; and
    fixing the connector to the cover.

9. The method of claim 8, further comprising mounting the base on an engine block.

10. The method of claim 8, wherein the flexible connecting member is a flexible printed circuit board.

11. The method of claim 8, wherein the base and cover are fixed together with at least one of glue and screws.

12. A method for assembling an electronic control device having an electronic unit, a housing that is constructed of a base and a cover, a connector for electrically connecting the electronic unit with an external electrical device, and a flexible connecting member, comprising the steps of:

arranging a first connecting terminal on a circuit board included in the electronic unit adjacent to an edge of the circuit board;

electrically and directly connecting a first end of the flexible connecting member to the first connecting terminal;

fixing the circuit board to the base;

arranging a second connecting terminal on a side surface of the connector, the side surface being perpendicular to a base surface thereof that is to be fixed to the base of the housing;

electrically and directly connecting a second end of the flexible connecting member to the second connecting terminal;

fixing the base surface of the connector to the base at a position such that the second connecting terminal is adjacent to the first connecting terminal of the circuit board; and attaching the cover of the housing to the base.

13. The method of claim 12, further comprising mounting the base on an engine block.

14. The method of claim 12, wherein the flexible connecting member is a flexible printed circuit board.

15. The method of claim 12, wherein the base and cover are fixed together with at least one of glue and screws.

16. A method for assembling an electronic control device having an electronic unit, a housing that is constructed of a base and a cover, a connector for electrically connecting the electronic unit with an external electrical device, and a flexible connecting member comprising the steps of:

positioning a connector and a circuit board so that base surface of the connector and a base surface of the circuit board are level, the base surfaces to be fixed to the base of the housing;

arranging a first connecting terminal of the connector and a second connecting terminal of the circuit board on the base surfaces;

electrically and directly connecting a first end of the flexible connecting member to the second connecting terminal, and a second end of the flexible connecting member to the first connecting terminal;

fixing the connector, the circuit boards and the flexible connecting member assembled into a unit at the electrically and directly connecting step to the base; and attaching the cover of the housing to the base.

17. The method of claim 16, further comprising mounting the base on an engine block.

18. The method of claim 16, wherein the flexible connecting member is a flexible printed circuit board.

19. The method of claim 16, wherein the base and cover are fixed together with at least one of glue and screws.

* * * * *